United States Patent [19]

Ootsuki et al.

[11] Patent Number: 4,942,140

[45] Date of Patent: Jul. 17, 1990

[54] METHOD OF PACKAGING SEMICONDUCTOR DEVICE

[75] Inventors: Hideaki Ootsuki; Mitsuyuki Takada; Toru Kokogawa; Hayato Takasago, all of Amagasaki, Japan

[73] Assignee: Mitsubishi Denki Kabushiki Kaisha, Japan

[21] Appl. No.: 363,710

[22] Filed: Jun. 9, 1989

Related U.S. Application Data

[63] Continuation-in-part of Ser. No. 171,448, Mar. 21, 1988, abandoned.

[30] Foreign Application Priority Data

Mar. 25, 1987 [JP] Japan .................. 62-72245
Mar. 25, 1987 [JP] Japan .................. 62-72246

[51] Int. Cl.$^5$ ................ H01L 21/60; H01L 21/603; H01L 21/56
[52] U.S. Cl. .................... 437/211; 437/209; 29/841; 357/72; 174/52.2; 264/272.11
[58] Field of Search .............. 437/209, 211; 29/841; 174/52 PE, 52.2, 52.4; 264/272.11; 357/72

[56] References Cited

U.S. PATENT DOCUMENTS 3,838,984 10/1974 Crane et al. .................. 29/193.5

FOREIGN PATENT DOCUMENTS

| 3110080 | 9/1982 | Fed. Rep. of Germany . |
| 56-76543 | 6/1981 | Japan . |
| 57-73958 | 5/1982 | Japan . |
| 57-149741 | 9/1982 | Japan . |
| 58-121634 | 7/1983 | Japan . |
| 59-99730 | 6/1984 | Japan . |
| 60-47430 | 3/1985 | Japan . |
| 0047430 | 3/1985 | Japan . |

OTHER PUBLICATIONS

Kamei et al., "Hybrid Structures Using Solder Reflow Technology", IEEE Transactions on components . . . , 1979, pp. 208–217.

Hoffman, "TAB Implementation and Trends", Solid State Technology, Jun. 1988, pp. 85–88.

Primary Examiner—Brian E. Hearn
Assistant Examiner—M. Wilczewski
Attorney, Agent, or Firm—Leydig, Voit & Mayer

[57] ABSTRACT

In a method of packaging a semiconductor device, the semiconductor device and a mounting body are positioned in such a manner that electrodes of the semiconductor device and leads of the mounting body are brought into slidable mechanical contact with each other, the electrodes being not bonded to the leads. Next, an insulating resin that shrinks on setting is supplied in such a manner that the contacted portions of the electrodes and the leads are covered. Subsequently, the resin is set while keeping the electrodes and the leads in contact with each other to bond the electrodes to the leads whereby the resin, when set, applies a compressive force between the electrodes and the leads.

24 Claims, 4 Drawing Sheets

METHOD OF PACKAGING SEMICONDUCTOR DEVICE

CROSS REFERENCE TO RELATED APPLICATIONS

This disclosure is a continuation-in-part of U.S. patent application Ser. No. 171,448 filed Mar. 21, 1988 now abandoned.

BACKGROUND OF THE INVENTION

1. Field of the Invention:

The present invention relates to a method of packaging a semiconductor device in which a semiconductor device is attached to a mounting body, such as a substrate or a film carrier, and is connected thereto.

2. Description of the Related Art:

Electronic devices in general employ large numbers of semiconductor devices such as ICs. In these electronic devices, the semiconductor devices are packaged on a substrate by soldering, as disclosed in the specification of Japanese Patent Laid-Open No. 45996/1982. To solder the semiconductor devices to the substrate, a soldering material is supplied between a semiconductor device and the substrate by printing with a solder paste or by disposing solder balls therebetween, the substrate then being heated by placing it on a hot plate.

In this packaging method, since the substrate is heated from below to a temperature corresponding to the melting point of the solder (about 230° C. in the case of a solder which contains Sn and Pb at the ratio of 60:40) or above, the devices and/or resin coating that are attached to the substrate must be heat-resistant. Further, heating of the substrate may cause it to warp. Also, the electrodes on which soldering is done must be made of a conductive material to which solder can be attached, thereby increasing the production cost and lowering the reliability of the devices.

FIG. 8 shows a method of packaging a semiconductor device on a film carrier which is disclosed in the specification of Japanese Patent Laid-Open No. 135265/1977. A semiconductor device 1 employed in this method has Au plated electrodes 2. A base film 4 which serves as a body of a film carrier 3 and which is made of a polyimide resin is provided with an opening 5. A lead pattern 6 is formed on the base film 4 by a photoetching process. The leads are made of, for example, Cu, and the surfaces of the forward ends thereof which hang over the opening 5 are Sn plated to a thickness of 0.5 m.

To package the semiconductor device on the film carrier, after the semiconductor device 1 is placed on a jig (not shown) with its electrodes turned face up, the film carrier 3 is positioned with respect to the semiconductor device 1 in such a manner that the semiconductor device 1 is located within the opening 5 and that the leads 6 are located above the electrodes 2 with a gap formed therebetween being about 100 m. Next, a heating jig 7 is lowered from above the film carrier 3 to press the Sn plated forward ends of the leads 6 downward and heat them at the same time. The leads 6 are therefore brought into contact with the electrodes 2 while the leads 6 and the electrodes 2 are being heated, so that the Sn coated on the leads 6 melts and is diffused into the Au layer plated on the surfaces of the electrodes 2. As a result, an Au-Sn alloy is formed, and electrical connections between the leads 6 and the electrodes 2 are provided. The heating jig 7 is then raised, whereupon the packaging of the semiconductor device 1 is completed.

As the semiconductor device and the substrate are heated in the previously-mentioned packaging method, the contacted portions of the leads 6 and the electrodes 2 must be heated to a temperature of 500° to 600° C. by the heating jig 7 in order to form an Au-Sn alloy. This may lead to cracking or degradation of the characteristics of the semiconductor device 1. Further, adjacent pads may be short-circuited by melted Sn plated on the surfaces of the leads 6.

Furthermore, when the semiconductor device is connected to the film carrier, it must be coated or molded with an epoxy, silicon, or polyimide resin by a separate and subsequent process to protect their connected portions. Therefore, the film carrier must be collected after the semiconductor device has been connected thereto, during which process the connected portions may be bent and peeled off. This decreases the production yield.

SUMMARY OF THE INVENTION

In view of the above-described problems of the prior art, an object of the present invention is to provide a method of packaging a semiconductor device on a mounting body, such as a substrate or a film carrier, that ensures high reliability and productivity, without exposing the mounting body and semiconductor device to a large heat shock.

To this end, the present invention provides a method of packaging a semiconductor device which comprises the steps of: positioning a semiconductor device and a mounting body in such a manner that electrodes of the semiconductor device and leads of the mounting body are brought into slidable mechanical contact with each other, the electrodes being not bonded to the leads; applying a settable electrically insulating resin that shrinks upon setting to cover portions of the electrodes and the leads that are in contact with each other; and setting the resin while keeping the electrodes and the leads in contact with each other to bond the electrodes to the leads whereby the resin, when set, applies a compressive force between the electrodes and the leads.

More specifically, in this invention, electrical connections are provided between the electrodes of the semiconductor device and the leads of the mounting body by mechanically contacting the electrodes of the semiconductor device with the leads of the mounting body and by maintaining their contact by the setting of an insulating material.

DESCRIPTION OF THE PREFERRED EMBODIMENTS

A first embodiment of the present invention will be described below with reference to FIGS. 1 to 3.

Figure 1:
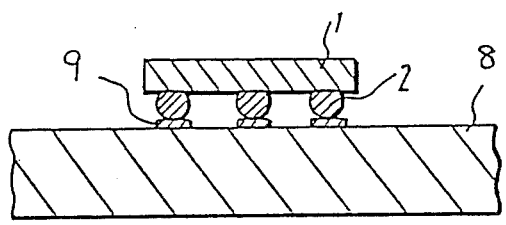
FIGS. 1 and 2 illustrate the processes in a method of packaging a semiconductor device, showing one embodiment of the present invention.

Referring first to FIG. 1, the surface of a semiconductor device 1 such as a flip-chip IC is provided with bumps 2 made of solder. A conductor pattern 9 is formed on a substrate 8, serving as a mounting body, as leads which are to be connected to the bumps of the semiconductor device 1. The semiconductor device 1 is attached to the substrate 8 in the manner described below.

First, the semiconductor device 1 is disposed in place on the substrate 8 so that the bumps 2 make contact with the conductor pattern 9 of the substrate 8 (FIG. 1).

Figure 2:
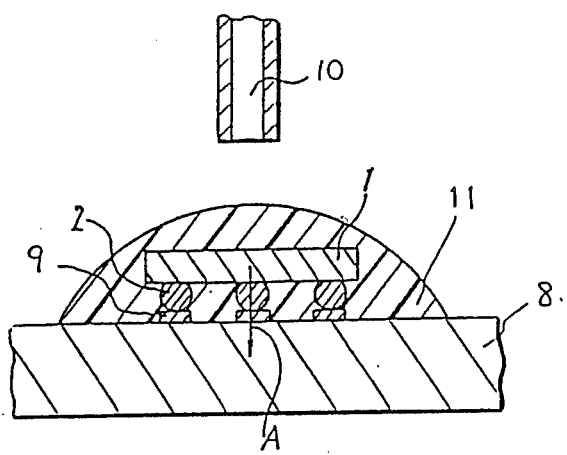
Figure 3:
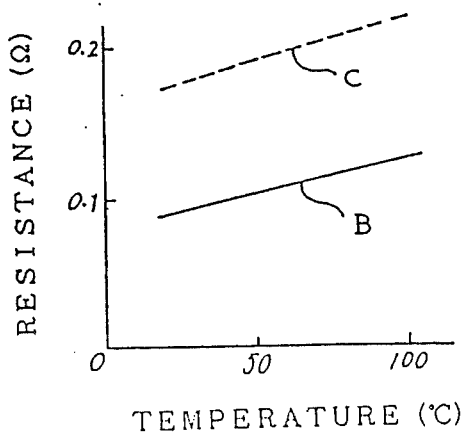
FIG. 3 shows the resistance of the connected portions obtained in the first embodiment of the invention and by a known method.

Next, a resin supply tube 10 is positioned above the semiconductor device 1, as shown in FIG. 2. Then an insulating resin 11 such as a thermoset epoxy resin is dropped therefrom over the semiconductor device 1. At this time, the insulating resin 11 having a suitable degree of viscosity covers the entirety of the semiconductor device 1 and makes contact with the surface of the substrate 8. A thermoset epoxy resin which has a positive coefficient of thermal expansion and shrinks by about 0.7% of its volume when it sets may be employed as the insulating resin 11.

Thereafter, the insulating resin 11 is heated to a temperature of about 150° C. by a heating device (not shown) to cause it to set. The setting of the insulating resin 11 attaches the semiconductor device 1 and the substrate 8 and reduces its volume, applying a force acting in the direction indicated by the arrow A to the semiconductor device 1. In consequence, the bumps 2 of the semiconductor device 1 are pressed against the conductor pattern 9 of the substrate 8, thereby providing electrical connections therebetween.

A flip-chip IC having a square shape with one side being about 4 mm and having 40 bumps made of solder was packaged on a glass substrate on which a copper thin-film pattern was deposited to provide a semiconductor device package. The bumps were each 160 m in diameter. The thus-formed semiconductor device package was then heated to 100° C. from room temperature and the resistance to the conduction between the bumps of the flip-chip IC and the thin-film pattern of the glass substrate was measured. A solid line B in FIG. 3 designates the results of the measurement. A broken line C in FIG. 3 denotes the results of the measurement of the resistance which were obtained from a semiconductor device with a package which employed the same components and in which packaging of the flip-chip IC was done by the known method of soldering.

As can be seen from the graph, resistance in the semiconductor device with the package according to the present invention is about half that of the semiconductor device with the package which is prepared by the soldering method, which means that excellent electrical interconnection is provided in the semiconductor device with the package according to the present invention. This is considered to be due to the fact that, in the method according to the present invention, the bumps of the IC are only mechanically contacted with the conductor pattern of the substrate and no diffusion of the molecules occurs in the contacted portions. In the soldering method, the molecules are diffused between the melted solder and the bumps of the IC or conductor pattern of the substrate, changing the layer structure of the electrode portions.

Figure 9:
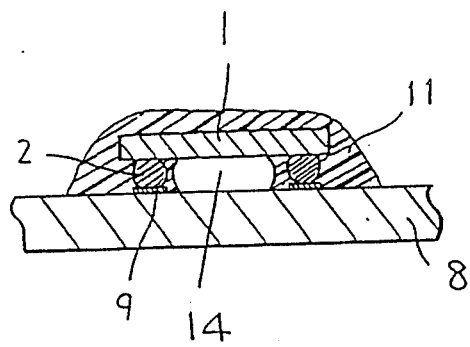
FIGS. 9 and 10 illustrate still other embodiments of the present invention.
Figure 10:
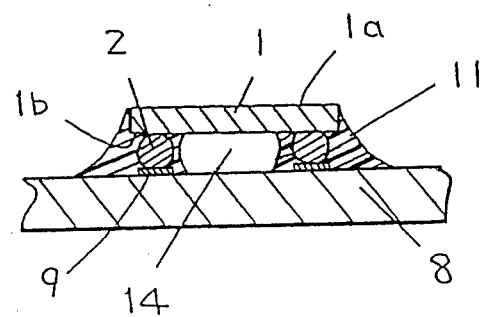

The resin 11 must be supplied to cover portions of the bumps 2 of the semiconductor device 1 and the conductor pattern 9 of the substrate 8 which are in contact with each other. As shown in FIG. 9, however, a hollow portion 14 may be left between portions of the semiconductor device 1 other than the bumps 2 and portions of the substrate 8 other than the conductor pattern 9 without being filled with the resin 11. In addition, the resin 11 may not be supplied on the back surface 1a of the semiconductor device 1 opposite to the front surface 1b on which the bumps 2 are formed as shown in FIG. 10. In this case, the resin 11 only covers the side portions and the front surface 1b of the semiconductor device 1.

Figure 4:
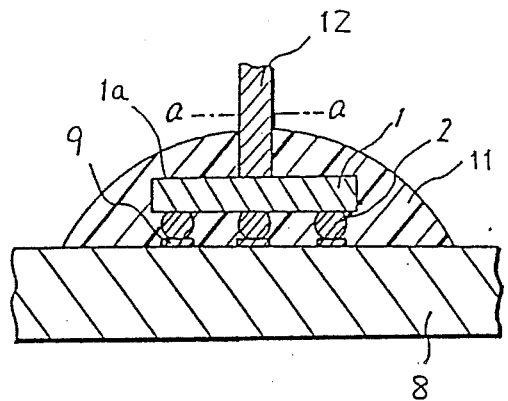
FIGS. 4 to 7 illustrate other embodiments of the present invention.

If a pressing force is applied to the semiconductor device 1 while the insulating resin 11 is setting or being supplied, an even better electrical interconnection can be provided. For example, a bar-shaped presser 12 may be brought into contact with a back surface 1a of the semiconductor device 1 to press the semiconductor device 1 toward the substrate 8 after the semiconductor device 1 has been positioned with respect to the substrate 8, as shown in FIG. 4. The insulating resin 11 is supplied in this situation and is then caused to set.

At this time, since the forward end of the presser 12 is fixed to the semiconductor device 1 by the insulating resin 11, it is cut at a portion which is located near the insulating resin 11 (at line a—a in FIG. 4) after the insulating resin 11 has set.

Thus, if the semiconductor device 1 is pressed, the bumps 2 of the semiconductor device 1 are more strongly pressed against the conductor pattern 9 of the substrate 8, as compared with the case where only the semiconductor device and the substrate are pressed against each other, and by the shrinking force of the insulating resin 11. In consequence, resistance to conduction in the contacted portions is further reduced, providing more reliable electrical connections. Even if the plurality of bumps 2 of the semiconductor device 1 vary in size, they are plastically deformed by the pressure applied thereto, and variations in size can therefore be absorbed.

In the case where the insulating resin 11 is supplied while the semiconductor device 1 is being pressed, shifting of the position of the semiconductor device 1, which may occur while the insulating resin 11 is being applied, can be prevented, even when a small semiconductor device 1 is employed, thereby increasing the reliability of the packaging.

Figure 5:
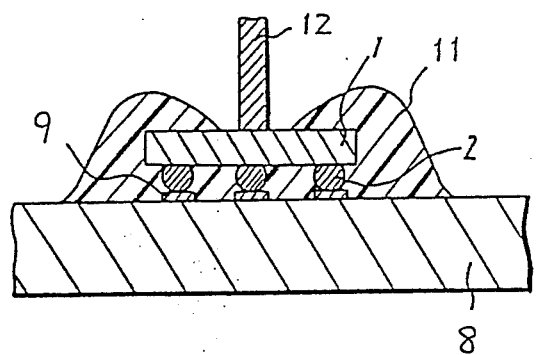

In the case where the insulating resin 11 is supplied to the periphery of the semiconductor device 1 in such a manner that it does not attach to the presser 12 and is then caused to set, as shown in FIG. 5, the presser 12 is not fixed to the semiconductor device 1. It is therefore not necessary for the presser 12 to be cut.

In another situation the insulating resin 11 is supplied and a flat plate (not shown), having an area larger than that of the back surface 1a of the semiconductor device 1, is in contact with the back surface 1a. At least the periphery of the flat plate is covered by the insulating resin 11 which is caused to set after the semiconductor device 1 has been positioned with respect to the substrate 8. The force caused by the shrinkage of the insulating resin 11 acting between the semiconductor device 1 and the substrate increases, providing for an excellent electrical interconnection without employing a presser such as that shown in FIG. 4. The pressing force can be adjusted by changing the area of the flat plate.

The substrate 8 may be a glass, ceramic or epoxy glass resin substrate with a thin-film conductor formed thereon by deposition, plating or sputtering or may be a thick-film conductor made of Ag-Pd formed thereon.

Since no soldering is performed, the bumps 2 of the semiconductor device 1 may be made of a conductive material other than solder.

Figure 6:
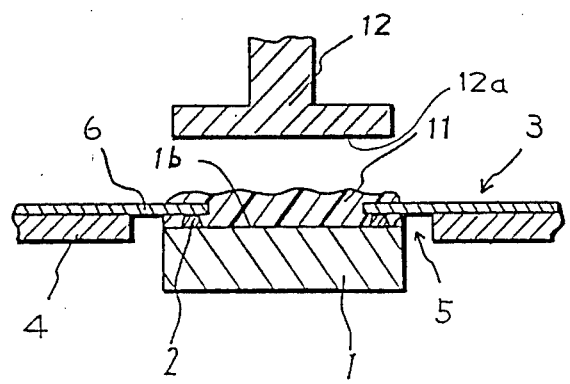

FIG. 6 shows an example of packaging the semiconductor device 1 on the film carrier 3 which serves as a mounting body. The semiconductor device 1 has Au plated electrodes 2. The base film 4 which serves as a body of the film carrier 3 and which is made of a polyimide resin is provided with the opening 5. The lead pattern 6 is formed on the base film 4 by a photoetching process. The leads 6 are made of, for example, Cu, and the surfaces of the forward ends thereof which hang over the opening 5 are Sn plated to a thickness of 0.5 m.

To package the semiconductor device on the film carrier, after the semiconductor device 1 is placed on a jig (not shown) with its electrodes turned face up, the film carrier 3 is positioned with respect to the semiconductor device 1 in such a manner that the semiconductor device 1 is located within the opening 5 and that the leads 6 are located above the electrodes 2 with a gap of about 100 m formed therebetween. After the film carrier 3 has been positioned in place, it is lowered to contact the leads 6 with the electrodes 2. Next, an insulating resin such as a thermoset epoxy silicon or polyimide resin is dropped through a resin supply tube (not shown) in such a manner that it covers the contacted portions of the electrodes 2 of the semiconductor device 1 and the leads 6. In the example shown in FIG. 6, the insulating resin 11 is supplied over the entirety of the surface 1b of the semiconductor device 1 on which the electrodes 2 are formed.

Subsequently, the presser 12 is lowered on the insulating resin 11 to press the forward ends of the leads 6 against the electrodes 2. The presser 12 has a flat plate-shaped pressing portion 12a at the forward end thereof by which the plurality of electrodes 2 formed on the semiconductor device 1 can be pressed at one time against corresponding leads 6. The insulating resin 11 is then heated in this state to a temperature of about 150° to 200° C. to cause it to set. In order to heat the insulating resin, both the semiconductor device 1 and the presser 12 may be heated by an external heating means. Alternatively, the presser 12 may be provided with a heating means such as a heater which heats the pressing portion 12a.

After the insulating resin 11 has been caused to set in the above-described manner, the presser 12 is separated from the insulating resin 11, whereupon the packaging of the semiconductor device is completed.

In this embodiment, the electrodes 2 of the semiconductor device 1 are Au plated, and the forward ends of the leads 6 are Sn plated. However, since these platings need not be combined to form an alloy, no plating is necessary, and the Al electrodes 2 of the semiconductor device 1 may be directly connected to the Cu leads 6. At this time, it is preferable for the electrodes 2 of the semiconductor device 1 to be formed in the shape of bumps to facilitate the pressing thereof against the leads.

Figure 7:
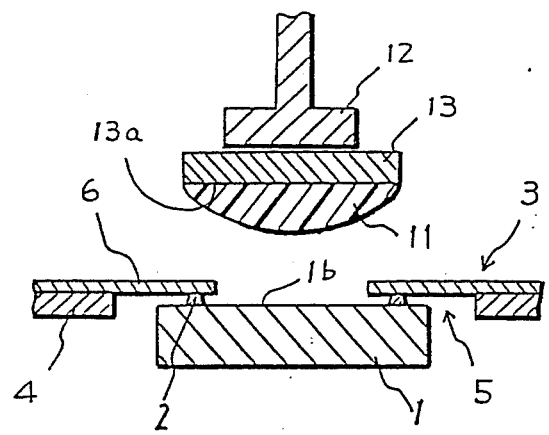
Figure 8:
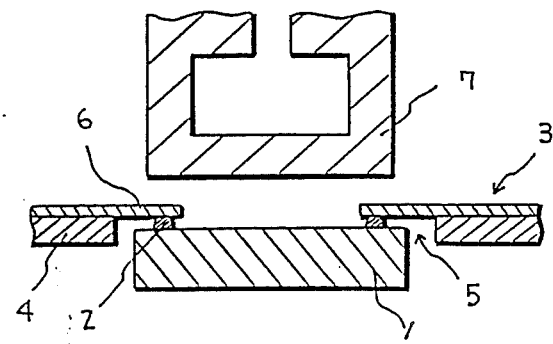
FIG. 8 illustrates a known method of packaging a semiconductor device.

As shown in FIG. 7, the insulating resin 11 may be coated on one surface 13a of a flat plate 13, the flat plate 13 then being pressed against the surface 1b of the semiconductor device 1 by the presser 12 with the surface 13a of the plate 13 facing the surface 1b of the semiconductor device 1. In this way, the resin can be supplied without using the resin supply tube.

If a transparent insulating resin 11 is used, it may be supplied on the surface 1b of the semiconductor device 1 before the positioning of the leads 6. This method, however, requires pressing the contacted portions of the leads 6 and the electrodes 2 with a force which ensures that the resin present on the electrodes 2 is forced out, to provide sufficient contact between the electrodes 2 of the semiconductor device 1 and the leads 6.

Since the electrodes 2 of the semiconductor device 1 are located close to the periphery thereof, the electrodes 2 and the leads 6 may be pressed against each other using a presser 12 which has an annular pressing surface (not shown) disposed in alignment with the electrodes 2 and a hollow central portion, the insulating resin 11 being supplied toward the semiconductor device 1 through this central hollow portion of the presser 12.

Thus, it is possible to package the semiconductor device 1 at a temperature at which the insulating resin 11 sets according to the present invention. Therefore, use of a resin having a low setting temperature enables the semiconductor device 1 to be packaged on a mounting body such as a substrate 8 or a film carrier 3 even when the device 1 incorporates devices or a resin coating which cannot resist heat generated due to soldering.

If an ultraviolet-curing or two-part type resin that sets at normal temperatures is used as the insulating resin, heating of the insulating resin can be eliminated, enabling the semiconductor device 1 to be packaged with the peripheral components not being adversely affected by heat. If the employed insulating resin 11 is a thermoset resin having a positive coefficient of expansion, such as epoxy, the resin cools to the normal temperature after the setting, generating a shrinking force which acts on the electrodes 2 and the leads 6 to press them against each other more strongly. Therefore, even if the temperature of the produced semiconductor device is raised close to a temperature at which the resin sets, a very stable electrical connection is ensured owing to the pressing force acting between the electrodes 2 and the leads 6 when a temperature cycle test is conducted.

The insulating resin 11 also serves as a protective molding resin. Therefore, the molding process of the semiconductor device 1 is eliminated, which leads to a reduction in the number of productions steps.

In this invention, since the electrical connection between the electrodes 2 and the leads 6 are provided by only the mechanical contact thereof, they may be made of any material including aluminum, indium tin oxide, or chrome, which are normally soldered with great difficulty, so long as the material employed is electrically conductive.

If a plurality of resin supplying tubes which supply different types of resin are employed, resins which have different setting temperatures can be selectively supplied in accordance with the material of the semiconductor device 1 or the mounting body, making the optimal packaging of the semiconductor device 1 possible.

If the amount of insulating resin 11 supplied is changed by the size of the semiconductor device 1, the shrinking force of the resin which is generated at the time of setting can be adjusted in accordance with the type of semiconductor device 1.

As has been stated, since the electrodes of the semiconductor device are only mechanically brought into contact with the leads of the mounting body i.e., they are not fuse bonded, when distortion due to heat occurs in the semiconductor device, the contacted surfaces of the electrodes and the leads slide against each other, relaxing the stress acting in the direction of the contacted surfaces.

As will be understood from the foregoing description, according to the present invention it is possible to package the semiconductor device onto a mounting body in a highly reliable manner without exposing the semiconductor device and the mounting body such as a substrate or a film carrier to a large heat shock. Further, since the insulating resin also serves as a protecting molding resin for a semiconductor device, a molding process which is conducted subsequent to the electrical interconnection of the semiconductor device can be eliminated, thereby increasing productivity.

What is claimed is:

1. A method of packaging a semiconductor device comprising:
   positioning a semiconductor device and a mounting body with the electrodes of said semiconductor device and the leads of said mounting body in slidable mechanical contact with each other, said electrodes not being bonded to said leads;
   applying a settable electrically insulating resin that shrinks upon setting, covering the portions of said unbonded electrodes and leads that are in contact with each other; and
   setting said insulating resin while keeping said electrodes and said leads in contact with each other to fix said electrodes to said leads whereby said resin, when set, applies a compressive force between said electrodes and said leads.

2. A method of packaging a semiconductor device according to claim 1 wherein said mounting body is a substrate.

3. A method of packaging a semiconductor device according to claim 2 including pressing said electrodes and said leads against each other during setting of said insulating resin.

4. A method of packaging a semiconductor device according to claim 3 wherein the pressing of said electrodes and said leads includes pressing said semiconductor device toward said mounting body with a bar-shaped presser.

5. A method of packaging a semiconductor device according to claim 4 including covering the contacting portions of said presser and said semiconductor device with said insulating resin.

6. A method of packaging a semiconductor device according to claim 5 including severing a portion of said presser which is covered with said insulating resin after said setting step has been carried out.

7. A method of packaging a semiconductor device according to claim 4 including removing the portion of said presser not covered by said insulating resin after said setting step has been completed.

8. A method of packaging a semiconductor device according to claim 2 wherein said resin applying and setting steps are carried out while a flat plate having an area larger than that of the surface opposite to that of said semiconductor device on which said electrodes are formed is in contact with said opposing surface of said semiconductor device.

9. A method of packaging a semiconductor device according to claim 2 wherein said substrate is a glass substrate.

10. A method of packaging a semiconductor device according to claim 1 wherein said mounting body is a film carrier.

11. A method of packaging a semiconductor device according to claim 10 including pressing said electrodes and said leads against each other during setting of said insulating resin.

12. A method of packaging a semiconductor device according to claim 11 wherein said film carrier has an opening into which the forward ends of said leads protrude, including contacting said electrodes with said leads within said opening.

13. A method of packaging a semiconductor device according to claim 12 including pressing said electrodes and said leads together by pressing the forward ends of said leads toward said semiconductor device using a presser.

14. A method of packaging a semiconductor device according to claim 13 wherein said presser has a flat plate-like pressing portion at its forward end.

15. A method of packaging a semiconductor device according to claim 13 wherein said pressing of said electrodes and said leads is performed through a flat plate disposed between the forward ends of said leads and said presser, said insulating resin being coated on a surface of said flat plate which faces the forward ends of said leads, said resin applying step being carried out by pressing said flat plate toward said semiconductor device.

16. A method of packaging a semiconductor device according to claim 1 including supplying said insulating resin as a liquid.

17. A method of packaging a semiconductor device according to claim 1 wherein said insulating resin is thermoset and has a positive coefficient of thermal expansion.

18. A method of packaging a semiconductor device according to claim 1 wherein said insulating resin is a cold setting resin.

19. A method of packaging a semiconductor device according to claim 1 wherein said semiconductor device is a flip-chip IC.

20. A method of packaging a semiconductor device according to claim 2 wherein said substrate is a ceramic substrate.

21. A method of packaging a semiconductor device according to claim 2 wherein said substrate is a epoxy glass substrate.

22. A method of packaging a semiconductor device according to claim 1 including leaving a hollow portion between portions of said semiconductor device other than said electrodes and portions of said mounting body other than said leads not filled with said resin after said setting step.

23. A method of packaging a semiconductor device according to claim 1 including supplying said resin over the surface opposite to a surface of said semiconductor device on which said electrodes are formed in said resin applying step.

24. A method of packaging a semiconductor device according to claim 1 including not supplying said resin on the surface opposite to a surface of said semiconductor device on which said electrodes are formed in said resin applying step.

* * * * *